United States Patent [19]

Warmerdam

[11] Patent Number: 5,317,250

[45] Date of Patent: May 31, 1994

[54] MODULAR ELECTRONIC METER HAVING REDUCED WIDTH

[75] Inventor: Petrus Warmerdam, Wetzikon, Switzerland

[73] Assignee: Zellweger Uster AG, Uster, Switzerland

[21] Appl. No.: 818,676

[22] Filed: Jan. 9, 1992

[30] Foreign Application Priority Data

Jan. 9, 1991 [CH] Switzerland .................. 00036/91

[51] Int. Cl.⁵ .................. G01R 1/04; G01R 19/00; G01R 15/00; H02B 1/00
[52] U.S. Cl. .................. 324/156; 324/114; 324/149; 361/660; 361/668; 361/735
[58] Field of Search .................. 324/97, 113, 114, 142, 324/149, 156, 157; 361/364, 365, 369, 372, 393, 394

[56] References Cited

U.S. PATENT DOCUMENTS

| | | | |
|---|---|---|---|
| 1,737,303 | 11/1929 | Eshbaugh | 324/156 |
| 2,705,902 | 4/1955 | Blowney | 324/97 X |
| 2,871,450 | 1/1959 | Podoloff | 324/156 X |
| 2,908,866 | 10/1959 | Heiland et al. | 324/114 |
| 3,333,191 | 7/1967 | Triplett | 324/97 X |
| 3,401,337 | 9/1968 | Beusman et al. | 324/149 |
| 4,041,358 | 8/1977 | Donahue et al. | 361/365 |
| 4,810,989 | 3/1989 | Brandenberg et al. | 336/84 |
| 5,001,420 | 3/1991 | Germer et al. | 324/114 X |

FOREIGN PATENT DOCUMENTS 0494427 7/1992 European Pat. Off. .
2257972 6/1974 Fed. Rep. of Germany ...... 361/365

Primary Examiner—Gerard R. Strecker
Attorney, Agent, or Firm—Burns, Doane, Swecker & Mathis

[57] ABSTRACT

A flat, modular measuring circuit having two connecting terminals for one phase of load current and a current sensor connected thereto. The two connecting terminals are arranged one above the other on one of the end faces of the module. This configuration leads to a significant reduction in the meter width and to a reduction in the production costs, since these modules can also be cost effectively produced in increased quantity and used for multi-phase meters.

17 Claims, 4 Drawing Sheets

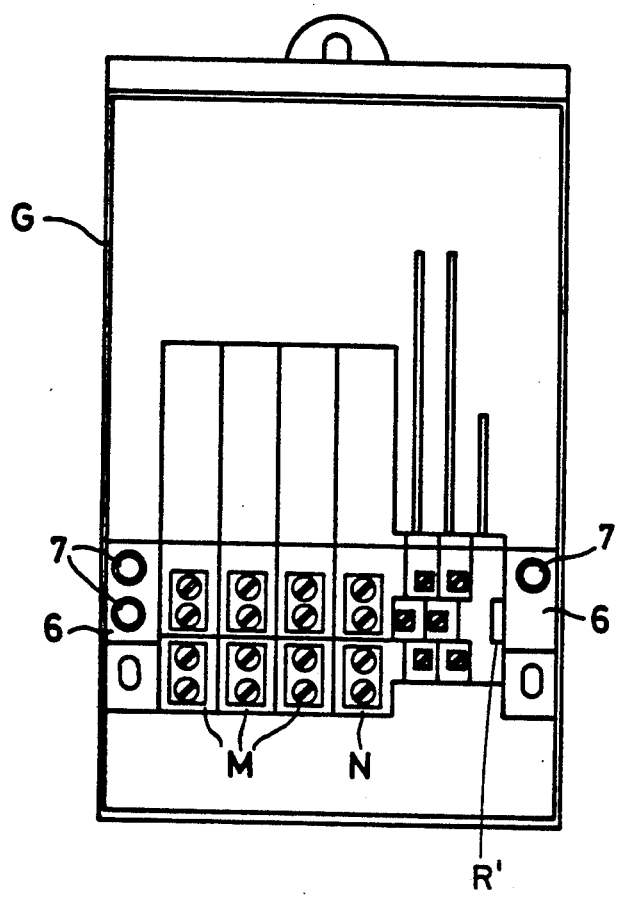
FIG. 4a
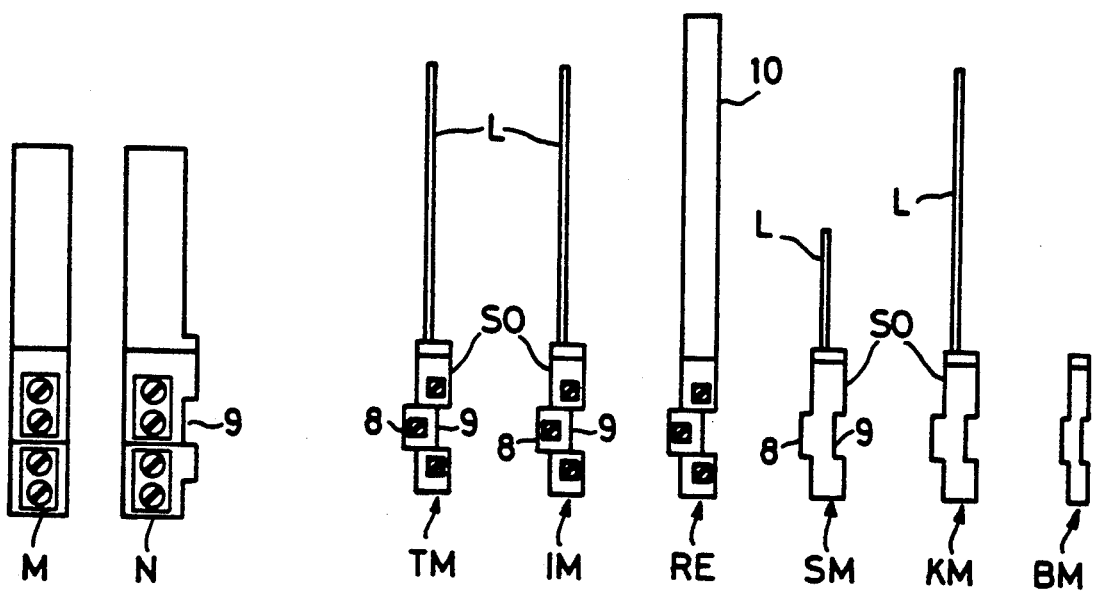
FIG. 4b
FIG. 4c

MODULAR ELECTRONIC METER HAVING REDUCED WIDTH

BACKGROUND OF THE INVENTION

The present invention relates to an electronic electricity meter with a measuring circuit having two connecting terminals for one phase of load current and a current sensor connected thereto.

The increasing miniaturization of electronics appears to have overlooked present-day electricity meters, including so-called solid-state, electronic meters. This is because at least the width of the meter housing, which is determined essentially by the connecting terminals arranged side-by-side, has not been significantly reduced in size. Further, production costs have not become any more favorable and there are no synergetic effects to be found between single-phase and multi-phase meters.

SUMMARY OF THE INVENTION

The invention is therefore directed to achieving, on the one hand, a simplification and reduction in the cost of meter production and, on the other hand, a detectable reduction in the meter dimensions.

This object is achieved by a measuring circuit designed in the form of a flat module with two connecting terminals being arranged one above the other on one of the end faces of the module.

Using two connecting terminals having the same terminal cross-section as the two connecting terminals of a conventional meter, the invention halves the meter width and permits the use of a terminal cross-section matched to the current intensity. The modular design leads to a reduction in production costs, since in practice only single-phase modules have to be produced, with multiple (e.g., triple) quantities being produced for multi-phase meters. If neutral conductor modules are also designed in the same form as the modules forming the measuring circuits, a uniform appearance of the different modules and a continuous modular structure of the electricity meters are produced.

BRIEF DESCRIPTION OF THE DRAWINGS

The invention is explained in more detail in the following text on the basis of an exemplary embodiment and the drawings, in which:

FIGS. 4a–4c show a schematic representation of a meter housing and of the modules arranged therein;

DETAILED DESCRIPTION OF THE PREFERRED EMBODIMENTS

Figure 2:
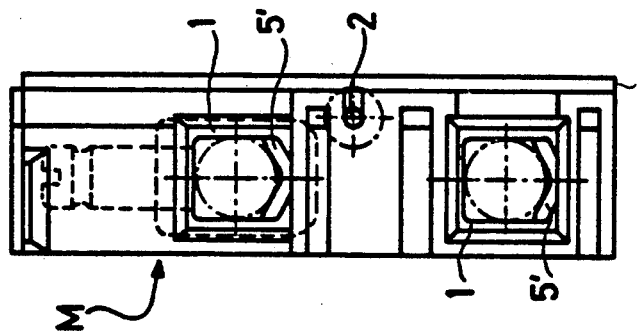
FIG. 2 shows a view in the direction of the arrow II in FIG. 1.
Figure 1:
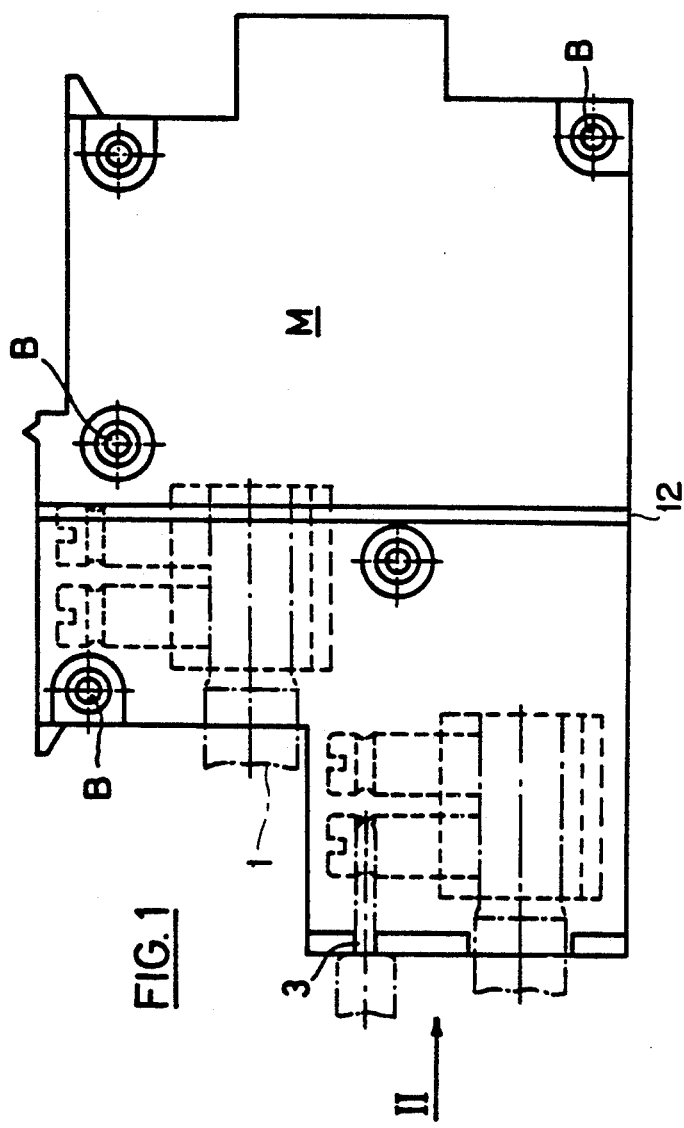
FIG. 1, for purposes of the following discussion, is considered to represent a side elevation of a measuring cell.
Figure 3:
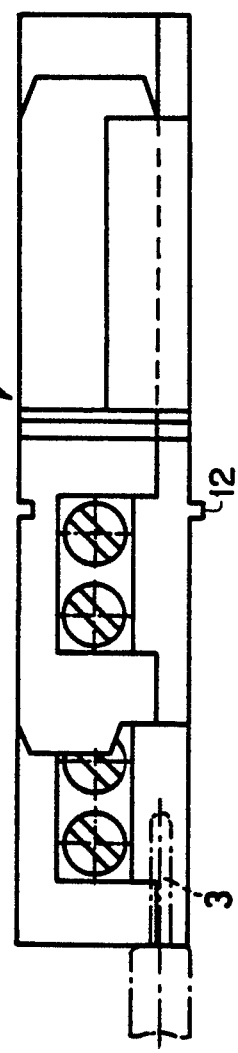
FIG. 3 shows a top plan view onto the measuring cell in FIG. 1.

FIGS. 1 to 3 show a measuring cell M of an electricity meter in three views, to a scale of 1.5:1. According to the representation, this measuring cell is formed as a flat box with the approximate dimensions 90×60×16 millimeters and it contains a measuring circuit for one phase of the current to be measured. If this current is a three-phase alternating current, then the relevant electricity meter contains three such measuring cells M and a neutral conductor module of the same form, as a result of which a continuously modular structure and a uniform appearance of the electricity meter are achieved. Ribs and slots 12 and 14 provided on the outer wall of the measuring cell M are used for centering the individual modules in the meter housing and with respect to one another; rivets for attaching the housing cover are designated with the reference symbol B.

Each measuring cell M contains, in particular, two connecting terminals 1 of a current path which, according to the representation, are not arranged side-by-side, as was usual in the past, but one above the other. As a result, a significant reduction in the housing width is produced for a three-phase meter. The two connecting terminals 1 do not, of course, necessarily have to be aligned with one another; they can also be slightly offset with respect to one another. The essential feature is that they are located one above the other and not side-by-side. In this case, the mutual separation can be minimal, since the two connecting terminals of the current path of one phase actually exhibit the same voltage and the minimum distance required to achieve the surge-withstanding capability specified between two phases is thus not necessary. When the connecting terminals are arranged one above the other, the cross-section of the connecting terminals can be selected to be significantly larger than in the past and it can thus be matched to the respective current intensities within wide limits (e.g., 100A for a connecting wire bundle having a 25 mm$^2$ cross section).

As can be seen, in particular, from FIG. 2, in addition to the connecting terminals 1, the measuring cell M also has a connecting socket 2 for a pin or bolt 3, in the manner of a banana connector, which is used for calibration of the meter and whose operation is described in the CH Patent Application No. 00 037/91-4 of 09.01.1991, corresponding to U.S. application Ser. No. 07/818,675 filed on Jan. 9, 1992 the disclosure of which is hereby incorporated by reference in its entirety.

Figure 6:
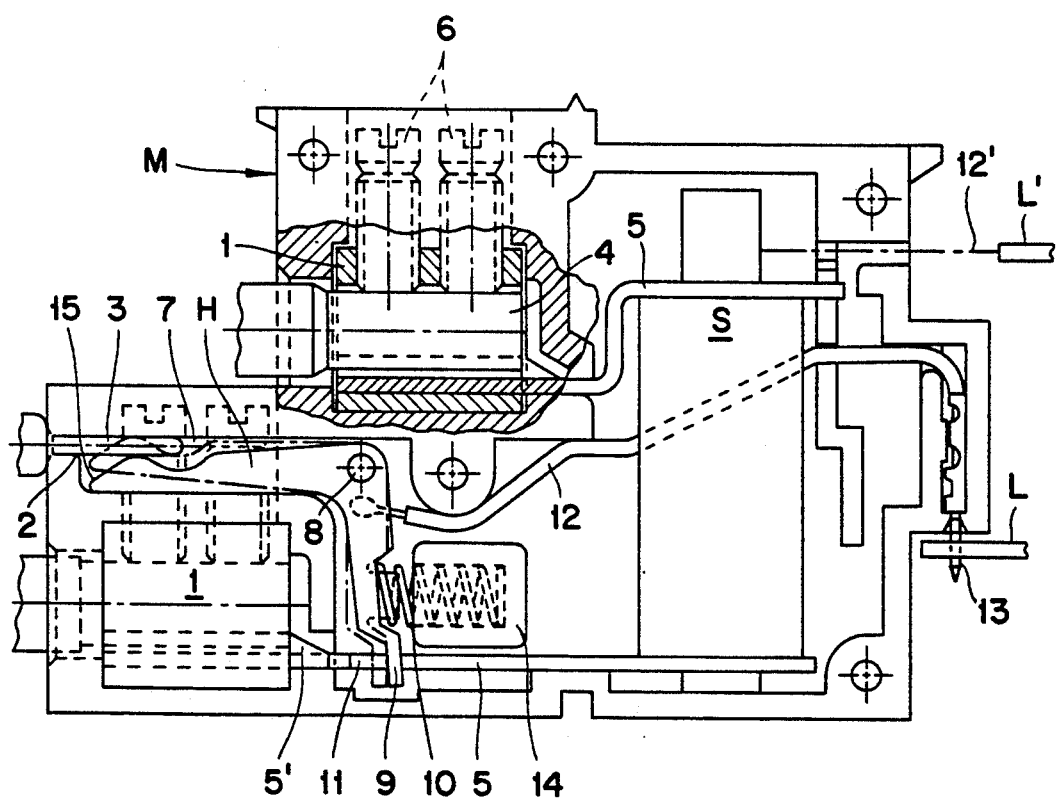
FIG. 6 shows a side view of the measuring cell with the housing cover removed.

FIG. 6 shows a front view of the measuring cell M with the housing cover removed, to a scale of 2:1, which measuring cell M is partially cut in the region of the upper connecting terminal 1 in FIG. 1. FIG. 6 shows the measuring cell M with connecting wires 4 clamped firmly in the connecting terminals 1 and with a pin 3 plugged into the socket 2. According to FIG. 6, there is a current sensor S connected to the connecting terminals 1 which does not, however, form an object of the present patent application and thus need not be described in greater detail here. An exemplary current sensor for use in FIG. 4 is described in Swiss Patent Application No. 03672/91-1 filed Dec. 13, 1991, the disclosure of which is hereby incorporated by reference. The current sensor S contains, inter alia, a current bracket, formed by a flat conductor, which has two busbars 5 leading to the connecting terminals 1. The busbars 5 are designed, in the region of the connecting terminals 1, in the form of a trough 5' into which the respective connecting wire 4 is inserted and is clamped firmly by screws 6. The connecting terminals 1 are fixed in corresponding recesses of the housing of the measuring cell M.

The already-mentioned pin or bolt 3 is connected to the voltage source of a calibration system (not shown) and is used for the calibration of the electricity meter which is as specified and mandatory for every measuring cell M. In the case of this calibration, the pin 3 is pushed into the socket 2 and a connection is thus produced between the said calibration system and the voltage circuit of the electricity meter, which voltage circuit is connected, in the operating state of the meter, to the meter's current path, that is to say to one of the busbars 5. The voltage circuit is symbolized in FIG. 6 by a printed-circuit board L.

FIG. 6 shows the measuring cell during calibration, that is to say with the pin 3 inserted into the socket 2. According to the representation, the socket 2 turns into a depression 7 inside the housing, in which an angled pivoting lever H is arranged, supported on a rotating shaft 8, The lower end of the pivoting lever H is designed as a contact part 9 which, in the operating state of the meter, that is to say with the pin 3 not plugged in, is pressed by a spring 10 against a cam 11 which projects laterally from the busbar 5 located on the lower connecting terminal 1. Consequently, in the operating state of the meter, with the position of the pivoting lever H as indicated with dotted-and-dashed lines in FIG. 6, a connection to the voltage circuit of the measuring cell M (printed-circuit board L) is produced from the lower busbar 5, via the cam 11, the pivoting lever H, a flexible wire 12 which is attached to the pivoting lever H and is conductively connected thereto, and a plug 13.

With respect to FIG. 6, above the printed-circuit board L there is arranged a second printed-circuit board which contains the electronics for evaluating the signals of the current sensor S. These signals are passed to the exterior via a wire symbolized by a dotted-and-dashed line 12'. As can be seen, the two wires 12 and 12' cross one another approximately at a right angle, at which the mutual influence of the signals of the two wires is minimal.

The compression spring 10, which presses the contact part 9 of the pivoting lever H against the cam 11, is held in a mounting 14 of the measuring cell housing and is electrically insulated. The compression spring 10 is fixed on the pivoting lever H on a projection provided with grooves or with another means of attachment.

In the region of the end of its horizontal arm which is located in the path of the pin 3 when the latter is pushed into the socket 2, the pivoting lever H has an operating surface 15, which runs obliquely with respect to the longitudinal axis of the pin 3 and crosses the latter, against which operating surface 15 the pin 3 presses when it is pushed into the socket 2. In consequence, the pivoting lever H is pivoted out of its operating position, which is indicated with dotted-and-dashed lines in FIG. 6, into the calibration position, indicated with solid lines, in which the contact between the cam 11 and the pivoting lever end 9, and hence between the busbar 5 and the voltage circuit L of the measuring cell, is interrupted. For this purpose, an electrical connection exists via the pivoting lever H between the pin 3, and hence the calibration system, and the voltage circuit of the measuring cell of the electricity meter.

FIG. 4a shows a schematic representation of the lower part G of a meter housing and the modules arranged in the housing, which are represented individually in FIGS. 4b and 4c. According to the representation, the housing lower part G contains two mounting rails 6 with slots and ribs R' or engaging the corresponding opposing pieces of the individual modules. In this way, the mounting of the modules in the housing can take place simply by plugging the module stack into the mounting rails 6. The module stack is fixed by screwing a cover to holes 7 in the mounting rails 6.

The meter according to FIG. 4a contains three measuring modules (measuring cells) M of the type represented in FIGS. 1 to 3 and a neutral module N; these are the so-called base modules, which are represented separately once again in FIG. 4b. The remaining space adjacent to the neutral module N is provided for so-called option modules for additional functions (FIG. 4c). All these option modules have a fixing rib 8 on their one side surface and a fixing slot 9 on their other side surface; the neutral module N is likewise provided with a fixing slot 9 on its side surface adjacent to the option modules, so that all these modules can easily be pushed into one another and fixed.

The following exemplary option modules can be present:

Switching relay RE triggered by a ripple-control receiver;

Tariff modules TM for external tariff or period control;

Pulse transfer contacts IM for the transfer of the measuring pulses for other purposes, for example for displays or the like, and/or of control pulses for a maximum-meter. These control pulses can, for example, be those for the measuring periods or for resetting the maximum meter;

Interfaces SM for remote reading of the meter, irrespective of whether this is deliberate, active remote reading at a location remote from the meter, for example by pushing a card into an output equipment, or by signalling the meter state back via the network to a central control;

Customer-specific modules KM for the connection of external meter pulses from other meters (e.g. gas, water);

Blanking parts BM for filling any free space resulting between the mounting rails.

All the option modules have a base part SO on which the fixing rib 8 and the fixing slot 9 are designed, as well as the necessary contacts electrically connecting each option module to the measuring circuit. The blanking parts BM consist only of a base. In the case of the switching relays RE a flat housing 10 is attached to the base, in which housing the actual relay is arranged. In the case of the other option modules, that is, in the case of the tariff modules TM, in the case of the pulse transfer contacts IM, in the case of the interfaces SM for remote meter reading and in the case of the customer-specific modules KM, the base supports a printed-circuit board L. In addition, the widths of all the modules, that is to say the base and the option modules, are matched to one another. For example, all the base modules M and N have a width of 16.5 and all the option modules (with the exception of the blanking parts BM) have a width of 11 millimeters. The width of the blanking parts BM is 5.5 mm and the distance between the mounting rails 6 is an integer multiple of the base module width plus the width of a blanking part BM. It can easily be seen that the space between the mounting rails can always be completely filled with this stepping of the widths.

Figure 5:
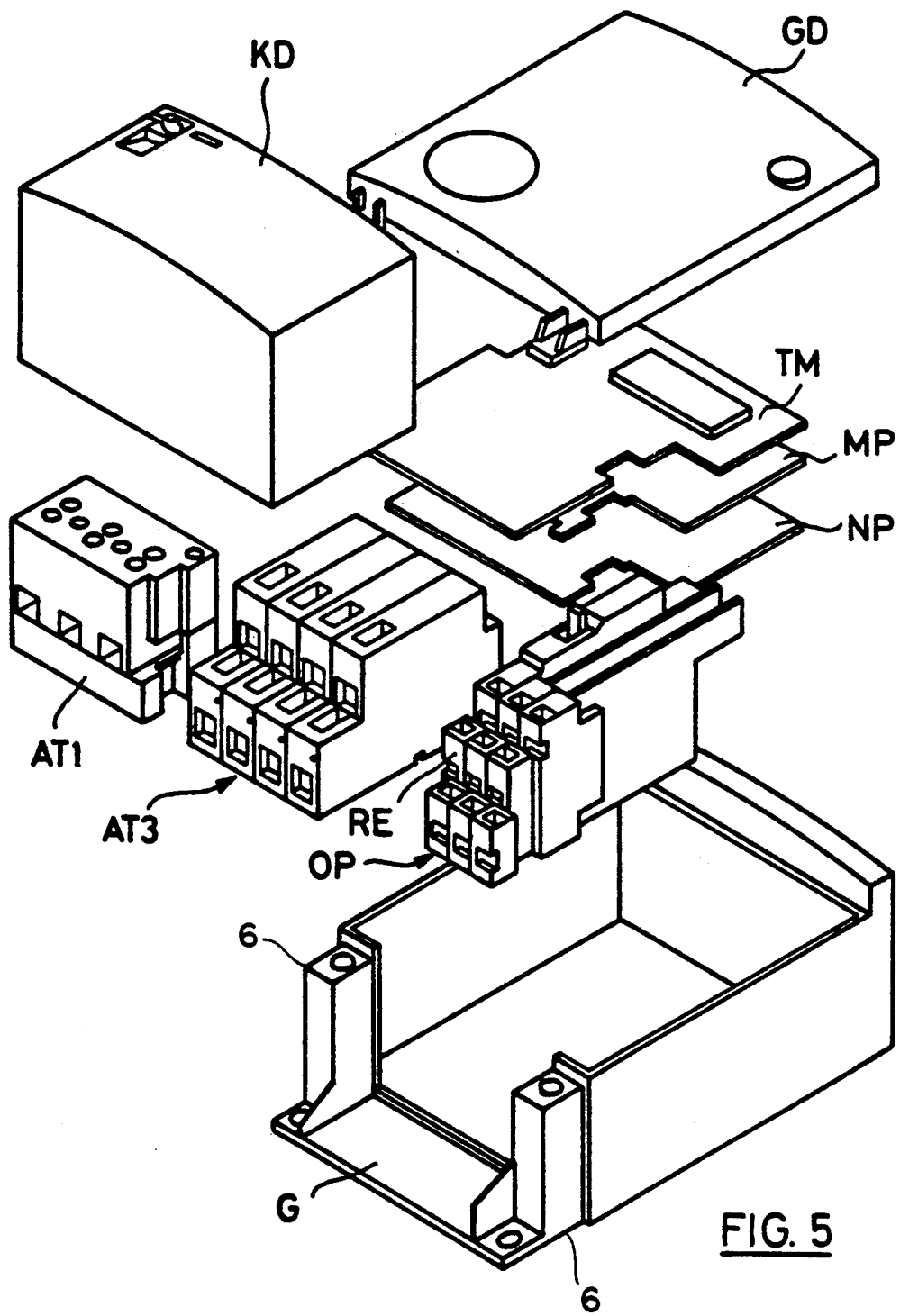
FIG. 5 shows an exploded representation of a meter housing, using modules to clarify the modular equipment concept.

FIG. 5 shows the modular equipment concept on the basis of an exploded representation of the individual parts of an electricity meter. As in FIG. 4a, the housing lower part is designated with the reference symbol G;

AT3 designates a three-phase connecting part with an integrated transducer, which contains three measuring modules M and a neutral module N, in an analogous manner to FIG. 4a; the reference symbol AT1 designates a single-phase connecting part with two measuring circuits, which can be inserted in the housing lower part G as an alternative to the three-phase connecting part AT3; and the reference symbol OP designates three option modules, a switching relay RE underneath them on the extreme left.

When the required connecting parts and option modules are attached in the housing lower part G, some more board-like modules are placed thereon, namely a measuring board MP with an interface to the option modules, a tariff module TM with a suitable display area (LCD) and an electro-optical interface, and a power supply board NP, the latter only in the case of three-phase meters, however. Finally, the housing cover GD and the terminal cover KD are attached, both of which can be lead sealed.

The described design of the measuring circuit as a module with connecting terminals arranged one above the other reduces the meter dimensions quite considerably and leads to a noticeable reduction in production costs, since only one model has to be produced for the measuring circuits, and since this single model is produced in a correspondingly increased quantity.

The described concept means that the final configuration to be delivered to the customer does not need to be defined until very late in the production sequence and that meters which have already been delivered and installed can be extended or modified by insertion or replacement of modules. The latter is not only an advantage for the producer but also for the customer.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Electronic electricity meter of modular structure comprising:
    a box-like housing having a plurality of modules, each of said modules performing different functions and being interconnected to form a module stack, at least one of the modules being a measuring circuit for measuring a load current;
    means attached to said box-like housing for holding said module stack within the box-shaped housing, the measuring circuit being a three-dimensional box-shaped module having first, second and third dimensions representing a length, a height and a width, respectively of said measuring circuit, said length being defined by a first separation distance between first and second opposing end faces of said measuring circuit and said width being defined by a second separation distance between third and fourth opposing end faces located perpendicular to said first and second end faces, said height being greater than said width, said measuring circuit further including:
    two connecting terminals for detecting a single-phase load current, said two connecting terminals being arranged one above the other along an axis parallel to said height of said measuring circuit and being exposed on said first end face of said measuring circuit; and
    a current sensor which is connected to said connecting terminals.

2. Electricity meter according to claim 1, wherein the two connecting terminals are located vertically one above the other along said first end face, said first end face comprising a first portion wherein one of said two connecting terminals is exposed on said measuring circuit, and a second portion wherein another of said two connecting terminals is exposed on said measuring circuit, said first and second portions being offset different distances from said second end face.

3. Electricity meter according to claim 2, wherein the measuring circuit further includes:
    ribs and slots located on an exposed surface of the measuring circuit module for engagement with corresponding slots and ribs of other modules.

4. Electricity meter according to claim 3, wherein said at least one of said plurality of modules includes:
    a neutral module for structural interconnection with the measuring circuit module.

5. Electricity meter according to claim 4, further including:
    a plurality of additional modules for structural interconnection with the measuring circuit module in said box-shaped housing.

6. Electricity meter according to claim 5, wherein all of said plurality of modules are of similar shape, each module further including:
    a fixing rib on one end surface and a fixing slot on another end surface for structural interconnection with adjacent modules in the box-shaped housing.

7. Electricity meter according to claim 6, wherein all of said plurality of modules of the electricity meter are plugged together to form said module stack, said holding means of said electricity meter further including:
    means for retaining the module stack in the box-shaped housing.

8. Electricity meter according to claim 7, wherein the retaining means includes:
    mounting rails into which the module stack is interconnected.

9. Electricity meter according to claim 6, wherein at least some of the plurality of additional modules consist of:
    a base part; and
    a printed-circuit board supported by the base part.

10. Electricity meter according to claim 8, further including:
    blanking parts shaped similar to the plurality of additional modules for matching a total width of the module stack to a distance between the mounting rails of the retaining means.

11. Electricity meter according to claim 6, wherein said plurality of additional modules further includes:
    a switching relay triggered by a ripple-control receiver.

12. Electricity meter according to claim 6, wherein said plurality of additional modules further includes:
    a tariff module structurally interconnected with said measuring circuit module in the electricity meter for providing external tariff or period control.

13. Electricity meter according to claim 6, wherein said plurality of additional modules further includes:

pulse transferring contacts for transferring measuring pulses and/or control pulses.

14. Electricity meter according to claim 6, wherein said plurality of additional modules further includes:
an interface for remote reading of the meter.

15. Electricity meter according to claim 6, wherein said plurality of additional modules further includes:
a customer-specific module for connection of external meter pulses.

16. An electronic meter for measuring single phase or multi-phase current comprising:
a box-shaped housing having a lower part which includes at least one slot and one rail for receiving one or more single phase current measuring modules;
at least one current measuring module, said current measuring module further including:
an exterior formed with at least one rib and one slot for engagement with said at least one slot and rail, respectively of said box-shaped housing to position the measuring module in the box-shaped housing; and
two connecting terminals for establishing a current path with a current sensor to connect the measuring module with one phase of a load current to be measured, said connecting terminals being exposed on a two-dimensional end surface of said exterior of said measuring module, and being arranged next to one another along an axis parallel to a first dimension of said two dimensional end surface, wherein said first dimension of said end surface is greater than a second dimension of said end surface, said connecting terminals having a cross-section matched to an intensity of current to be measured when said measuring module is placed in said box-shaped housing.

17. An electronic meter according to claim 16, further comprising:
a plurality of measuring modules identical to said at least one measuring module, said plurality of measuring modules and said at least one measuring module each including a rib and slot configuration for interlocking said plurality of measuring modules and said at least one measuring module in said box-shaped housing.

* * * * *